(12) United States Patent
Fetzer

(10) Patent No.: US 10,326,042 B2
(45) Date of Patent: Jun. 18, 2019

(54) HIGHLY DOPED LAYER FOR TUNNEL JUNCTIONS IN SOLAR CELLS

(71) Applicant: The Boeing Company, Chicago, IL (US)

(72) Inventor: Christopher M. Fetzer, Valencia, CA (US)

(73) Assignee: The Boeing Company, Chicago, IL (US)

( * ) Notice: Subject to any disclaimer, the term of this patent is extended or adjusted under 35 U.S.C. 154(b) by 87 days.

(21) Appl. No.: 15/267,192

(22) Filed: Sep. 16, 2016

(65) Prior Publication Data

US 2017/0005217 A1 Jan. 5, 2017

Related U.S. Application Data

(62) Division of application No. 12/404,795, filed on Mar. 16, 2009, now Pat. No. 9,722,131.

(51) Int. Cl.
| | | |
|---|---|---|
| H01L 31/0687 | (2012.01) | |
| H01L 31/0352 | (2006.01) | |
| H01L 31/18 | (2006.01) | |
| H01L 31/0693 | (2012.01) | |
| H01L 29/88 | (2006.01) | |

(52) U.S. Cl.
CPC .. H01L 31/1844 (2013.01); H01L 31/035272 (2013.01); H01L 31/0687 (2013.01); H01L 31/0693 (2013.01); H01L 29/88 (2013.01); Y02E 10/544 (2013.01); Y02P 70/521 (2015.11)

(58) Field of Classification Search
CPC ......... H01L 31/0687; H01L 31/035272; H01L 31/0693; H01L 31/1884
See application file for complete search history.

(56) References Cited

U.S. PATENT DOCUMENTS

| | | |
|---|---|---|
| 5,342,453 A | 8/1994 | Olson |
| 6,316,715 B1 | 11/2001 | King et al. |
| 2003/0136442 A1 | 7/2003 | Takamoto |

FOREIGN PATENT DOCUMENTS

| | | |
|---|---|---|
| JP | 64-037060 | 2/1989 |
| JP | 9 082995 | 3/1997 |
| WO | 2002/23640 | 3/2002 |

OTHER PUBLICATIONS

Yamaguchi et al.,Multi-junction III-V solar cells: current status and future potential, Solar Energy 2005.*

(Continued)

Primary Examiner — Matthew T Martin
(74) Attorney, Agent, or Firm — Vivacqua Law

(57) ABSTRACT

A highly doped layer for interconnecting tunnel junctions in multijunction solar cells is presented. The highly doped layer is a delta-doped layer in one or both layers of a tunnel diode junction used to connect two or more p-on-n or n-on-p solar cells in a multijunction solar cell. A delta-doped layer is made by interrupting the epitaxial growth of one of the layers of the tunnel diode, depositing a delta dopant at a concentration substantially greater than the concentration used in growing the layer of the tunnel diode, and then continuing to epitaxially grow the remaining tunnel diode.

17 Claims, 6 Drawing Sheets

(56) References Cited

OTHER PUBLICATIONS

Jung et al., "AlGaAs/GaInP heterojunction tunnel diode for cascade solar cell application", Journal of Applied Physics, pp. 2090-2093, vol. 74, No. 3, American Institute of Physics (Aug. 1, 1993).

DeSalvo, "Ultrathin delta doped GaAs and AlAs tunnel junctions as interdevice ohmic contacts", Journal of Applied Physics, 74, pp. 4207-4212; DOI: 10.1063/1.354425 (Sep. 15, 1993).

Ragay F.W. et al., "Application of delta-doping in GaAs tunnel Junctions", Electronic Letters, IEE Stevengate, GB LNKD—DOI: 10.1049/EL: 19940002, vol. 30, No. 1, pp. 86-87 (Jan. 6, 1994).

Wang et al., "Growth and electrical characterization of Si delta-doped GaInP by low pressure metalorganic chemical vapor deposition", Journal of Applied Physics, pp. 8054-8059, vol. 79, No. 10, American Institute of Physics (May 15, 1996).

Yamaguchi M. et al., "Multi-junction III-V Solar Cells: Current Status and Future Potential", Solar Energy, Pergamon Press. Oxford, GB, vol. 79, No. 1, pp. 78-85 (Jul. 1, 2005).

PCT, International Search Report and Written Opinion; International Patent Application No. PCT/US2010/023171 (dated Aug. 23, 2010).

U.S. Non-Final Office Action, U.S. Appl. No. 12/404,795 (dated Dec. 1, 2011).

U.S. Final Office Action, U.S. Appl. No. 12/404,795 (dated Jul. 18, 2012).

U.S. Advisory Action, U.S. Appl. No. 12/404,795 (dated Nov. 19, 2012).

U.S. Non-Final Office Action, U.S. Appl. No. 12/404,795 (dated Dec. 22, 2014).

U.S. Final Office Action, U.S. Appl. No. 12/404,795 (dated Jul. 9, 2015).

U.S. Advisory Action, U.S. Appl. No. 12/404,795 (dated Nov. 2, 2015).

U.S. Non-Final Office Action, U.S. Appl. No. 12/404,795 (dated Feb. 9, 2016).

JP, Notice of Reasons for Rejection, Japanese Patent Application No. 2015-120850 (dated Apr. 12, 2016).

U.S. Notice of Allowance, U.S. Appl. No. 12/404,795 (dated Jun. 17, 2016).

Kurita H et al, "High-Efficiency Monolithic InGaP/GaAs Tandem Solar Cells with Improved Top-Cell Back-Surface-Field Layers," Proceedings of the International Conference on Indium Phosphide and Related Materials, Hokkaido, May 9-13, 1995, pp. 516-519, vol. CONF. 7, IEEE, New York.

\* cited by examiner

δ-DOPED MANUFACTURING PROCESS

HIGHLY DOPED LAYER FOR TUNNEL JUNCTIONS IN SOLAR CELLS

RELATED APPLICATIONS

This application is a divisional of U.S. application Ser. No. 12/404,795, filed Mar. 16, 2009.

U.S. GOVERNMENT RIGHTS

This invention was made with Government support under DE-FC36-07G017052 awarded by the Department of Energy. The Government has certain rights in this invention.

FIELD

Embodiments of the subject matter described herein relate generally to a method for improving the electrical characteristics of an interconnecting tunnel junction between adjacent solar cells and a multijunction solar cell having the improved interconnecting tunnel junction.

BACKGROUND

Multijunction solar cells are stacks of specifically oriented current generating p-n junction diodes or subcells. When electrically connected in series, current generated in one subcell is passed to the next subcell in series. Electrical characteristics of the interconnecting tunnel junction between subcells contribute to the overall efficiency of the multijunction solar cell.

SUMMARY

Presented is a method for improving the electrical characteristics of the interconnecting tunnel junction between subcells of a multijunction solar cell and a multijunction solar cell having the improved interconnecting tunnel junction. In various embodiments, the method and improved interconnecting tunnel junction comprise a narrow, delta-doped layer within the interconnecting tunnel junction that improves the current handling capability of the interconnecting tunnel junction between subcells of the multijunction solar cell.

The features, functions, and advantages discussed can be achieved independently in various embodiments of the present invention or may be combined in yet other embodiments further details of which can be seen with reference to the following description and drawings.

BRIEF DESCRIPTION OF THE DRAWINGS

The accompanying figures depict various embodiments of the system and method of highly doped layer for tunnel junctions in solar cells. A brief description of each figure is provided below. Elements with the same reference number in each figure indicated identical or functionally similar elements. Additionally, the left-most digit(s) of a reference number indicate the drawing in which the reference number first appears.

DETAILED DESCRIPTION

The following detailed description is merely illustrative in nature and is not intended to limit the embodiments of the invention or the application and uses of such embodiments. Furthermore, there is no intention to be bound by any expressed or implied theory presented in the preceding technical field, background, brief summary or the following detailed description.

Multijunction solar cells are constructed with a number of subcells stacked one on top of the other, each subcell being a current generating p-n junction diode. When light is incident on a subcell, photons having energies at or around the bandgap, Eg, are absorbed and converted into electrical current by the p-n junction. Photons having energies less than the bandgap are passed through the subcell to a lower subcell, while photons having energies higher than the bandgap are generally converted into excess heat. By using a topmost subcell with a comparatively high bandgap, and lower subcells of successively lower bandgaps, more of the available spectrum from the light is available to each subcell to be converted into electricity. Selection of the materials in each subcell determines the available energy to lower subcells.

Although for purposes of illustration and simplicity of explanation the following figures and description describe a multijunction solar cell having two cells, the system and methods described herein are equally applicable to solar cells having one, two, three or multiple cells. No limitation to a two cell multijunction solar cell is implied or intended.

Figure 1:
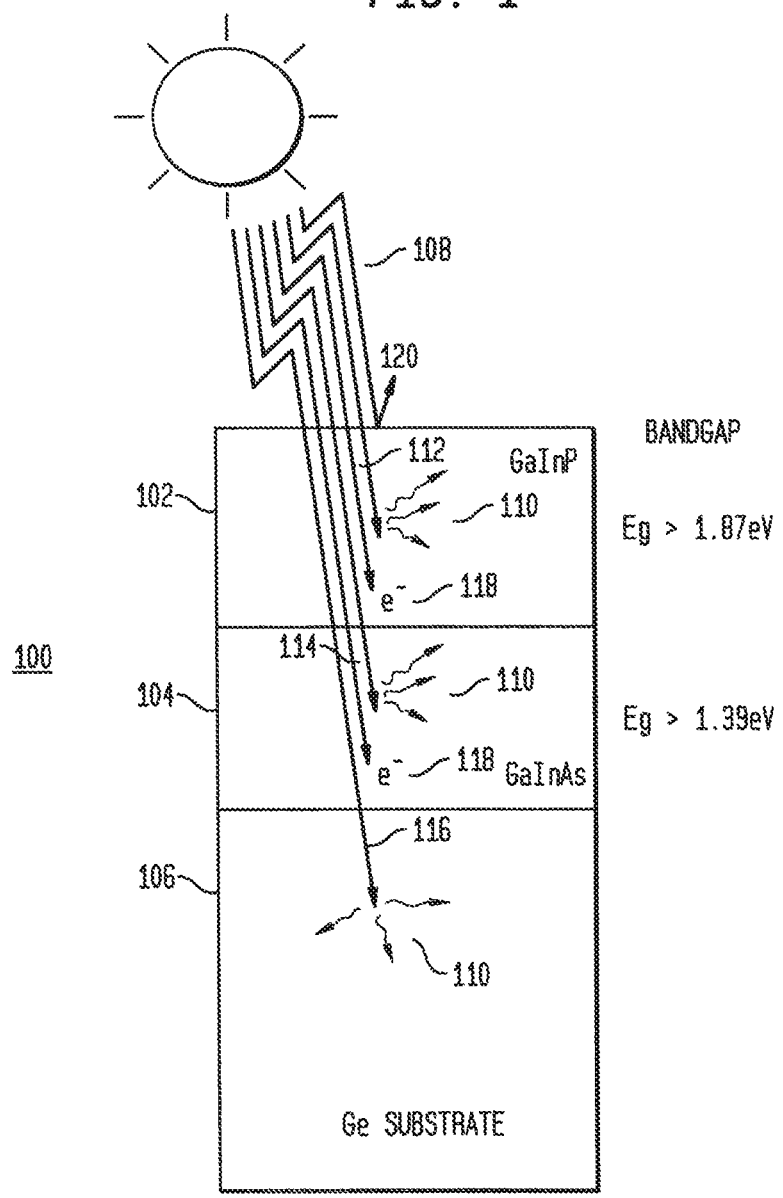
FIG. 1 is an illustration of bandgaps of two subcells of a multijunction solar cell in one embodiment of the highly doped layer for tunnel junctions in solar cells system and method.

Referring now to FIG. 1, in one non-limiting example, a two cell solar cell 100 having a top cell 102 comprised of Gallium Indium Phosphide (GaInP) and a bottom cell 104 comprised of Gallium Indium Arsenide (GaInAs) is presented. The cells 102, 104 are grown epitaxially, starting with a Germanium (Ge) substrate, and depositing layers of p-type GaInAs, n-type GaInAs, p-type GaInP, and n-type GaInP. Incident light 108 is directed at the top cell 102 of the two cell solar cell 100. A portion of the light 108 is reflected 120. A portion of the light 108 enters the top cell 102 and is absorbed and converted into heat 110, especially those high energy photons 112 in the light 108 having an energy higher than the bandgap of the GaInP material, Eg>1.87 eV, of the top cell 102. High energy photons 112 having energy approximating the bandgap of the GaInP material in top cell 102, Eg>1.87 eV, are absorbed by electrons in the GaInP material. The additional energy allows electrons bound in the valence band of the GaInP crystalline lattice to move into the higher energy conduction band, creating free electrons 118 that contribute to the current generation of the two cell solar cell 100. Low energy photons 114 have too little energy to free electrons 118 in the GaInP material and pass through the top cell 102 into the bottom cell 104. Although the bandgap is illustrated as 1.87 eV, the bandgap for GaInP may vary from approximately 1.75 eV to approximately 1.90 eV.

In the bottom cell 104, a portion of the light 108 is again absorbed and converted into heat 110, especially those low energy photons 114 that have an energy higher than the bandgap of the GaInAs material, Eg>1.39 eV, of the bottom cell 104. Low energy photons 114 having energy approximating the bandgap of the GaInP material in bottom cell 104, Eg>1.39 eV, are converted into free electrons 118. The remaining photons 116 pass into the substrate 106 where the remaining photons 116 generally are converted into heat 110. Although the bandgap is illustrated as 1.39 eV, the bandgap for GaInP may vary from approximately 1.35 eV to approximately 1.43 eV.

Figure 2:
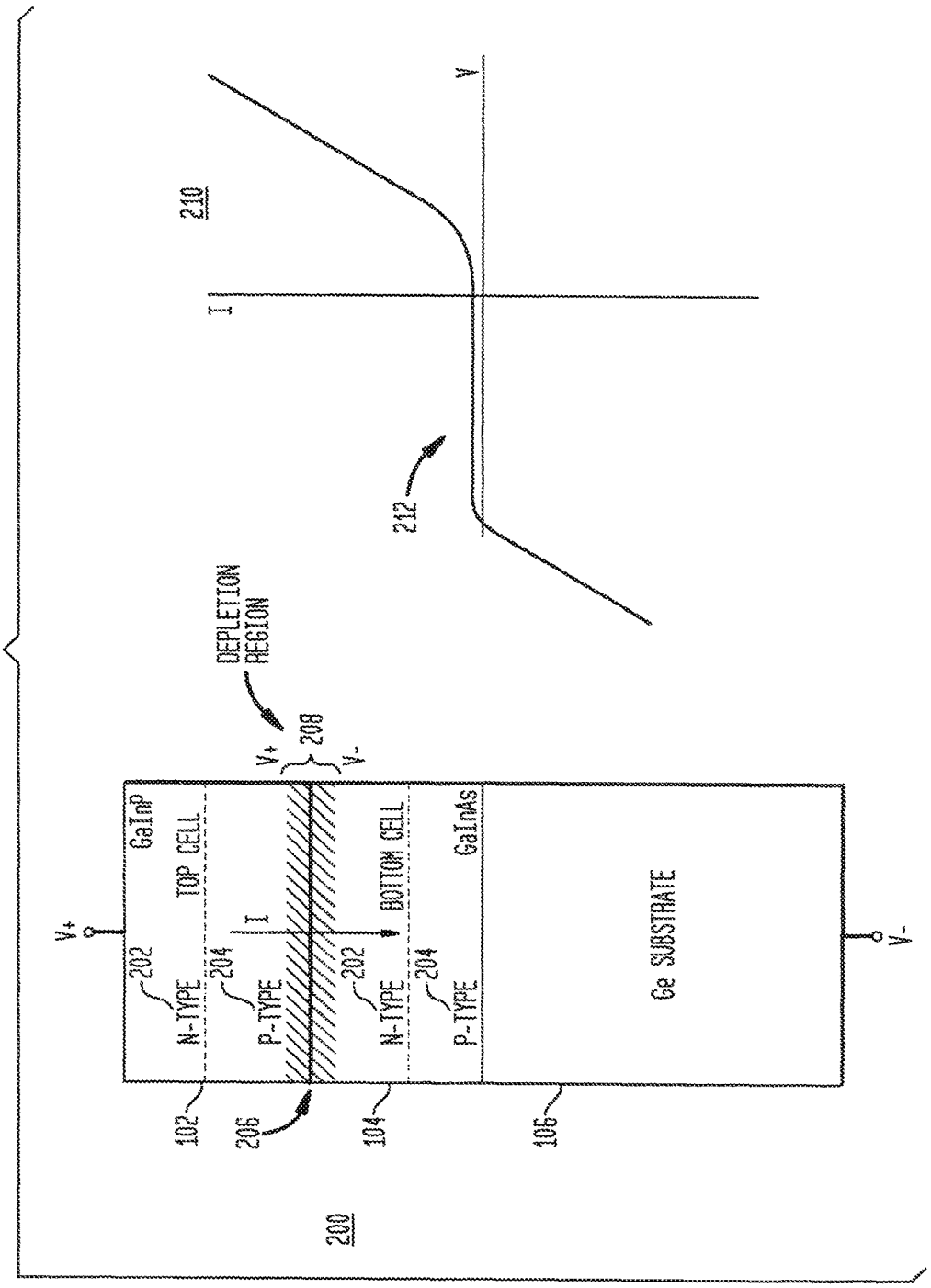
FIG. 2 is an illustration of a reversed biased junction between two subcells of a multijunction solar cell in one embodiment of the highly doped layer for tunnel junctions in solar cells system and method.

Each cell 102, 104 is comprised of a p-n junction diode that generates current. The p-n junction diodes can be n-on-p type junction diodes, or p-on-n type junction diodes. Referring now to FIG. 2, two stacked cells of n-on-p type junction diodes 200 are illustrated. Each cell 102, 104 is comprised of an n-type doped layer 202 and a p-type doped layer 204. Current is generated in the n-to-p direction in each cell as illustrated by the arrow I and collected through electrical connections V+ at the top of the two stacked cells of n-on-p type junction diodes 200, and V− at the substrate 106. By orienting the p-n junctions in both cells 102, 104 in the same direction, current generated by the top cell 102 passes through the bottom cell, and each cell 102, 104 amplifies the voltage of free electrons 118.

However, the voltage differential between the p-type doped layer 202 of the top cell 102, and the n-type doped layer 204 of the bottom cell creates a reversed biased junction 206 with a depletion region 208 relatively devoid of free electrons 118. As illustrated in the p-n junction voltage-current graph 210, for normal operating voltages only a small amount of leakage current 212 is capable of flowing across the reversed biased junction 206.

Figure 3:
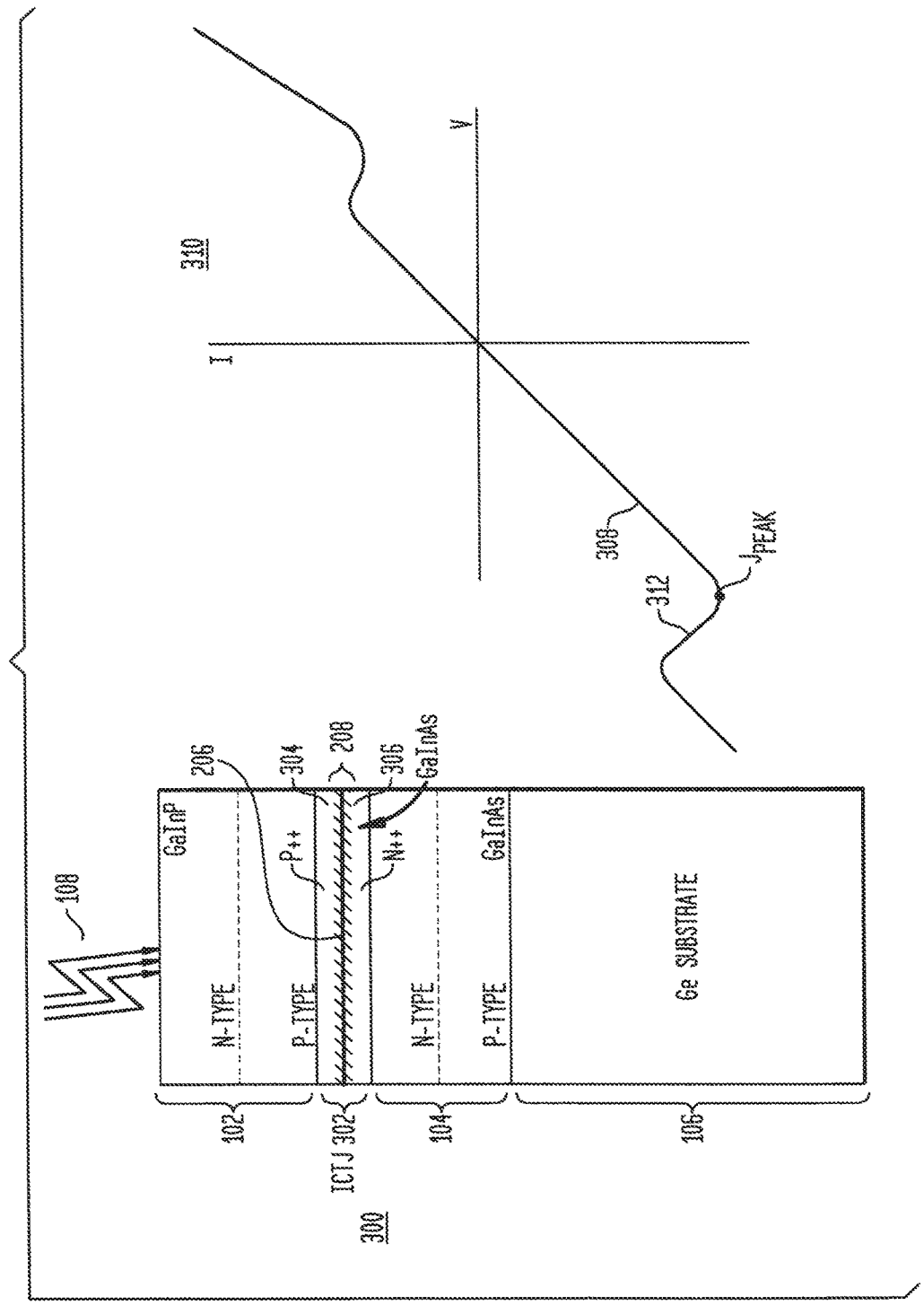
FIG. 3 is an illustration of an interconnecting tunnel junction between two subcells of a multijunction solar cell in one embodiment of the highly doped layer for tunnel junctions in solar cells system and method.

Referring now to FIG. 3, to increase the current carrying capability of the reversed biased junction 206, an interconnecting tunnel junction, or ICTJ 302, is epitaxially grown between the top cell 102 and the bottom cell 104 to create a multijunction solar cell 300. The ICTJ 302 in the multijunction solar cell 300 comprises a highly doped p+-type layer 304 of GaInAs, GaInP, or AlGaAs, and a highly doped n+-type layer 306 of GaInAs, GaInP, or AlGaAs. Through a quantum mechanical process, the highly doped ICTJ 302 allows electrons to penetrate across the depletion region 208, allowing an amount of tunneled current 308 to flow across the reverse-biased junction 206 that is proportional to the voltage, as illustrated in the tunnel junction voltage-current graph 310.

The ICTJ 302 is constructed to pass the large amount of current that flows between the top cell 102 and the bottom cell 104. The ICTJ 302 is optically transparent in order to pass as much light 108 as possible between the top cell 102 and the bottom cell 104. To maximize manufacturing yields, the ICTJ 302 design is not sensitive to slight variations common in high volume manufacturing processes. To increase optical transparency, the ICTJ 302 is thin and generally has a bandgap, Eg, equal to or higher than the bottom cell to avoid capturing light 108, specifically low energy photons 114 (shown in FIG. 1), that would otherwise be converted to free electrons 118 in the bottom cell 104. However, the thinness and bandgap, Eg, requirements for the ICTJ 302 limits the amount of dopants or intentional impurities ($N_A$ or $N_D$) that can be incorporated into the ICTJ 302. These limitations in turn limit the peak tunneling current through an approximate relationship:

$$J_{peak} \propto \exp(-Eg3/2NA \cdot ND/(NA+ND)))$$

Where $J_{peak}$ is the product of the volume and the energy of the electrons tunneling through the ICTJ 302 by quantum tunneling, Eg is the bandgap of the material used to grow the ICTJ 302, $N_A$ is the acceptor dopant concentration in the highly doped p+-type layer 304, and $N_D$ is the donor concentration in the highly doped n+-type layer 306. Note that lower dopant concentrations and higher bandgaps reduce the peak tunneling current possible in the ICTJ 302.

In terrestrial applications, incident light 108 is concentrated and focused on the multijunction solar cell 300. This increase in concentrated illumination increases the current flowing through the ICTJ 302. If the peak carrying capacity, $J_{peak}$, is exceeded, a knee 312, or sudden decrease, in amount of tunneled current 308 flowing across the reverse-biased junction 206 develops, as illustrated in the tunnel junction voltage-current graph 310. In concentrator applications, the intensity of the light 108 can be the equivalent of 2000 suns or 2000 times AM1.5, a measure of spectrum and amplitude of solar radiation reaching the surface of the earth. This corresponds to a minimum $J_{peak}$ of 30 A/cm². The ICTJ 302 is epitaxially grown as a thin 150 Å layer (~20 atomic layers) and therefore doping levels in such thin layers are well monitored to ensure proper dopant concentrations are achieved. However doping levels can drift during production and therefore a design criteria for a $J_{peak}$ of 100 A/cm² is used to ensure proper yields during the manufacturing process.

However, it is difficult to epitaxially grow a thin 150 Å layer (~20 atomic layers) ICTJ 302. In a typical manufacturing process, the ~20 atomic layers are deposited across a 20" substrate millions of times. A 10% variability in thickness is a standard requirement. The ICTJ 302 thickness therefore needs to be controlled to just + or −2 atomic layers across the entire area of the 20" substrate during manufacturing. Moreover, the peak amount of dopant ($N_A$ or $N_D$) scales inversely with the band gap, Eg, of the material being doped. This limits the $N_A$ or $N_D$ dopant concentration to the approximately $10^{19}$ cm$^{-3}$ range for materials having band gaps of 1.8 to 1.9 eV and $10^{20}$ cm$^{-3}$ for materials having a band gap of 1.4 eV.

Although using materials with lower bandgaps increases the permissible doping levels, materials having lower band gaps have reduced optical transparency. Reduced optical transparency reduces both the amount of light 108 available to the bottom cell 104 and the energy in those photons that are transmitted to the bottom cell 104, thereby reducing the energy producing capability and efficiency of the multijunction solar cell 300.

Using materials with higher bandgaps improves the transparency, but manufacturing the ICTJ 302 requires tight control of doping levels to achieve the minimum $J_{peak}$ of 30 A/cm² to 100 A/cm². Direct methods of doping the ICTJ 302 layers is limited as the bulk doping properties of Group VI dopants like Te, Se, and S are limited by the presence of an atomic surface liquid layer concentration that needs to be established prior to doping and the overall solubility of a bulk mixture. These manufacturing constraints limit the peak concentrations and limits how thin the ICTJ 302 layers can be reliably grown. Group IV dopants like C, Si, Ge, and Sn will act as both donors and acceptors negating the overall dopant concentration, limiting their usefulness to the range from approximately $10^{18}$ cm$^{-3}$ to low $10^{19}$ cm$^{-3}$ concentrations. Group II dopants like Zn, Cd, and Hg tend to be mobile in the lattice, diffusing away from high concentration regions during subsequent epitaxy processes. This reduces the applicability of using Group II dopants to achieve the high dopant concentrations necessary to epitaxially grow the ICTJ 302.

Figure 4:
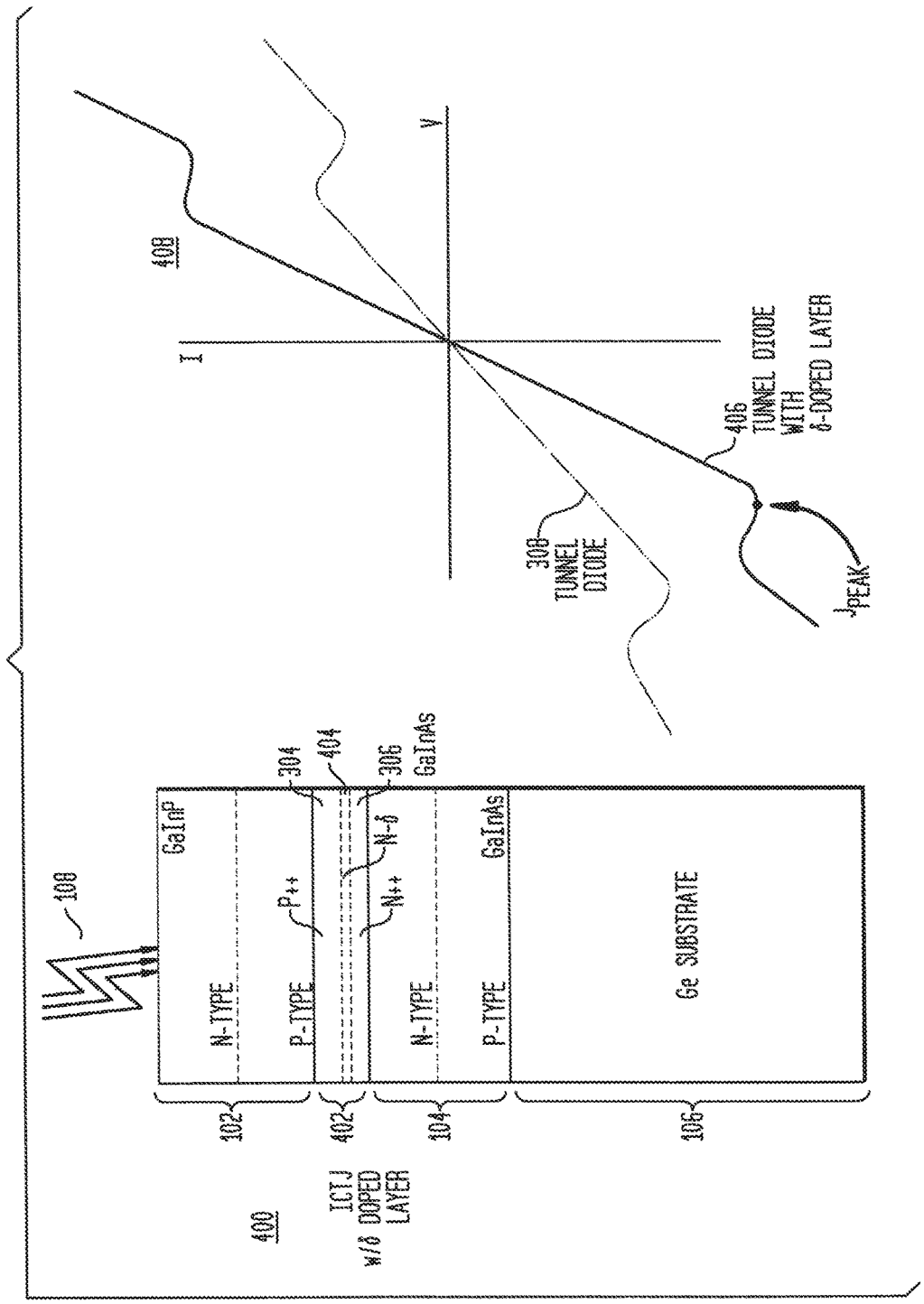
FIG. 4 is an illustration of an interconnecting tunnel junction having a delta-doped layer between two subcells of a multijunction solar cell in the highly doped layer for tunnel junctions in solar cells system and method.

Referring now to FIG. 4, a multijunction solar cell with a delta-doped layer 400 is presented. The multijunction solar cell with a delta-doped layer 400 comprises a top cell 102, and bottom cell 104, and an interconnecting tunnel junction with a delta-doped layer, or δ-doped ICTJ 402. The δ-doped layer 404 is a thin, approximately 20 A in width highly doped layer with a peak dopant concentration of $10^{20}$ cm$^{-3}$. The δ refers to the shape of the doping profile of the δ-doped layer that approaches a Dirac delta function. A Dirac delta function, or δ, is a function that is infinite at one point and zero everywhere else. The δ-doped layer 404 is positioned in the δ-doped ICTJ 402 and adds to the effective $N_A$ or $N_D$ dopants, increasing the peak tunneling current of the δ-doped ICTJ 402 layer. The δ-doped layer 404 increases the tunnel current carrying capability of the δ-doped ICTJ 402 by approximately a factor of two over the ICTJ 302 of FIG. 3 without a δ-doped layer 404. This is also illustrated in the δ-doped tunnel junction voltage-current graph 408, which shows the δ-doped tunnel current 406 for a reverse biased δ-doped ICTJ 402 to be approximately twice as steep as the curve representing the tunnel current 308 for an ICTJ 302 without a δ-doped layer 404.

Figure 5:
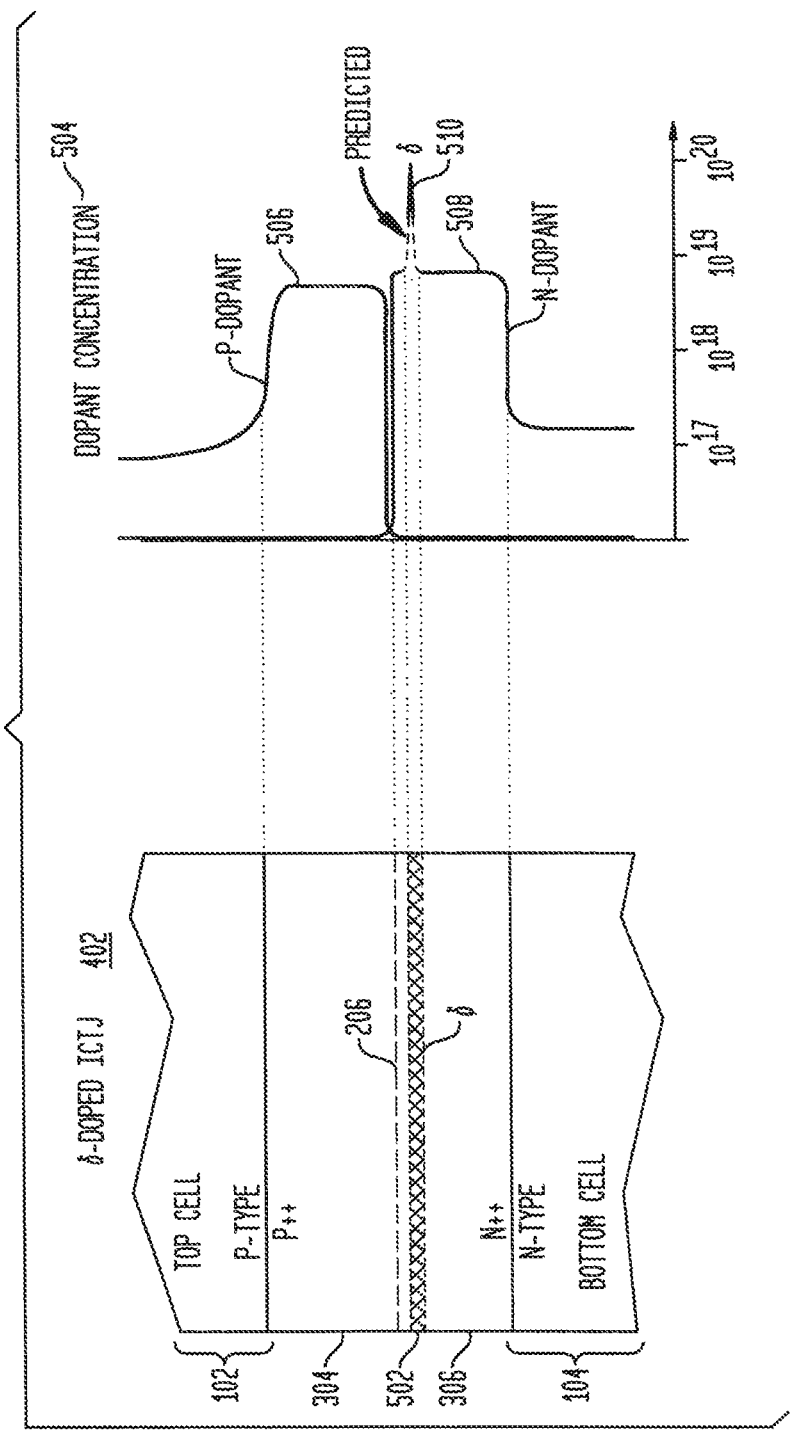
FIG. 5 is an illustration of an interconnecting tunnel junction having a delta-doped layer and corresponding dopant concentrations in one embodiment of the highly doped layer for tunnel junctions in solar cells system and method.

Referring now to FIG. 5, a δ-doped ICTJ 402 is shown in an exploded view. The highly doped p+-type layer 304 and the highly doped n+-type layer 306 adjoin to form the reversed biased junction 206. An n-type δ-doped layer 502 is displaced within the highly doped n+-type layer 306 in close proximity to the highly doped p+-type layer 304. Placing the n-type δ-doped layer 502 close to the highly doped p+-type layer 304 shortens the distance electrons have to travel to cross the reverse biased junction 206 and reduces the chance that electrons will recombine prior to crossing the reverse biased junction 206, improving the peak tunneling current density. A dopant concentration chart 504 illustrates approximately the relevant dopant concentration levels for the p-dopant concentration 506, the n-dopant concentration 508, and n-type δ-doped concentration 510 in the δ-doped ICTJ 402. A portion of the n-type δ-doped concentration 510 is estimated as shown by the dotted lines as the narrow width of the δ-doped layer makes concentrations difficult to measure.

In another embodiment, the n-type δ-doped layer 502 is directly adjacent to the highly doped p+-type layer 304. In other embodiments, the n-type δ-doped layer 502 is centered in the highly doped n+-type layer 306, displaced closer to the bottom cell 104, and placed between the bottom cell 104 and the highly doped n+-type layer 306. In another embodiment, the δ-doped ICTJ 402 contains p-type δ-doped layer (not shown) in the highly doped p+-type layer 304. In yet another embodiment, the δ-doped ICTJ 402 utilizes both a p-type δ-doped layer in the highly doped p+-type layer 304 and an n-type δ-doped layer 502 in the highly doped n+-type layer 306. In another embodiment, an ICTJ 302 is placed between the bottom cell 104 and the substrate 106. In yet another embodiment, a δ-doped ICTJ 402 is placed between the bottom cell 104 and the substrate 106. In other embodiments, one or more ICTJs 302 and/or one or more δ-doped ICTJs 402 are placed between adjacent cells or cells and other structures, including but not limited to electrical connection points and layers, in the multijunction solar cell with a delta-doped layer 400.

Although in the preceding figures and description each cell 102, 104 has been illustrated as an n-on-p type junction diode, and the δ-doped ICTJ 402 as a p-on-n tunnel junction, this was for illustration purposes only. In other embodiments, there are a plurality of cells 102, 104 and each cell 102, 104 is separated from an adjacent cell 102, 104 by a δ-doped ICTJ 402. In other embodiments, the multijunction solar cell with a delta-doped layer 400 comprises a plurality of cells 102, 104 that are p-on-n type junction diodes, and each cell 102, 104 is separated from an adjacent cell 102, 104 by a δ-doped ICTJ 402 that is an n-on-p tunnel junction.

In various embodiments, adjacent portions of the δ-doped ICTJ 402 and the cell 102, 104 have the same pin type doping, either both use acceptor type $N_A$ dopants or both use donor type $N_D$ dopants. The non-adjacent portion of the δ-doped ICTJ 402 has a complementary p/n type doping. For example, if the adjacent portion of the cell 102, 104 is a p-type type semiconductor material, then the adjacent portion of the δ-doped ICTJ 402 is also a p-type semiconductor material, and both comprise acceptor type $N_A$ dopants. The other portion of the δ-doped ICTJ 402 is a complementary n-type semiconductor material, and comprises a donor type $N_D$ dopants. The adjacent portions of the δ-doped ICTJ 402 and the cell 102, 104 use the same acceptor/donor type dopant, however in one embodiment the adjacent portions of the δ-doped ICTJ 402 and the cell 102, 104 use the same dopant, and in another embodiment the adjacent portions of the δ-doped ICTJ 402 and the cell 102, 104 use different dopants. In one embodiment the adjacent portions of the δ-doped ICTJ 402 and the cell 102, 104 use the same base semiconductor material. In one embodiment the adjacent portions of the δ-doped ICTJ 402 and the cell 102, 104 use the different base semiconductor materials. In one embodiment, both portions of the δ-doped ICTJ 402 use the same base semiconductor material. In one embodiment, the portions are comprised of different base semiconductor materials.

Figure 6:
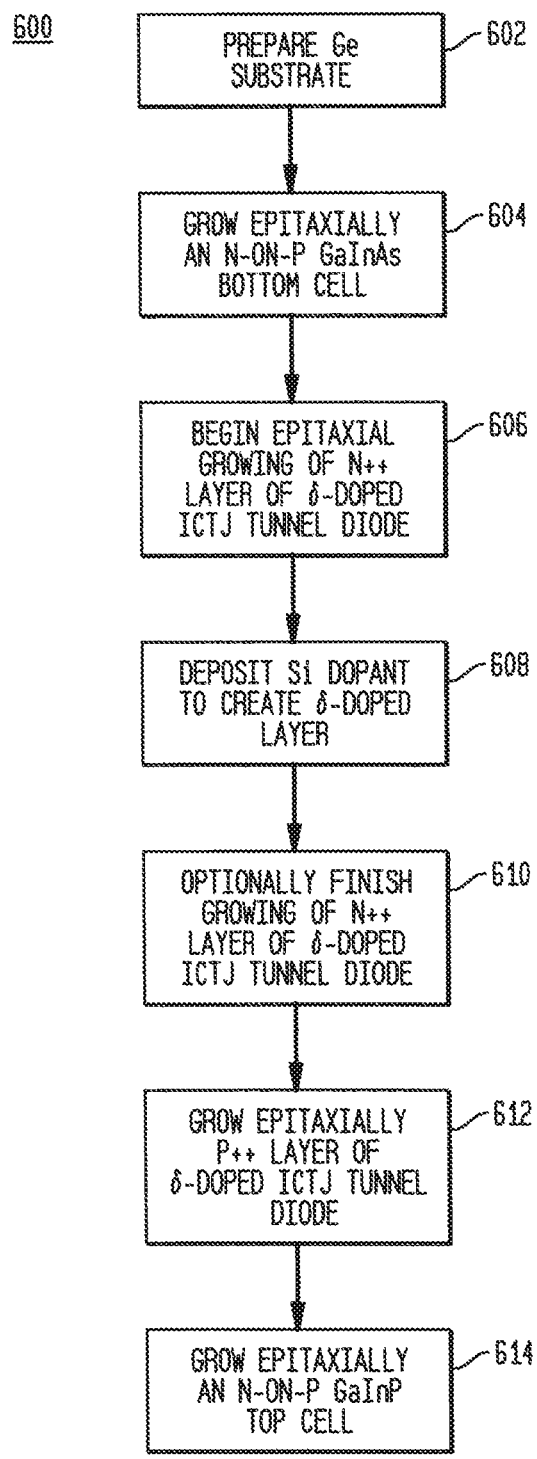
FIG. 6 is an block diagram of a manufacturing process for producing a multijunction solar cell having an interconnecting tunnel junction with a delta-doped layer in one embodiment of the highly doped layer for tunnel junctions in solar cells system and method.

Referring now to FIG. 6, in one non-limiting example the δ-doped ICTJ manufacturing process starts by preparing 602 a Ge substrate 106. On the Ge substrate 106, grow epitaxially 604 a bottom cell 104 of n-on-p GaInAs. After the bottom cell 104 is complete, begin to grow 606 the highly doped n+-type layer 306 of GaInAs of the δ-doped ICTJ 402. Then interrupt the grow 606 step for approximately one minute and deposit 608 a flow of $Si_2H_6$ at $4.5\times10^{-2}$ μmol/min for a total dose of $4.5\times10^{-2}$ μmol in the vapor along with an amount of $PH_3$ to produce the δ-doped layer 404. As an optional step, continue to grow 610 the remainder of the highly doped n+-type layer 306. Then grow epitaxially 612 the highly doped p+-type layer 304 of GaInAs. And finally grow epitaxially 614 the top cell 102 of n-on-p GaInP.

In one embodiment, $SiH_4$ is used instead of $Si_2H_6$. In one embodiment, the cells 102, 104 are p-on-n cells and the δ-doped ICTJ 402 is an n-on-p tunnel junction. In one embodiment the δ-doped layer 404 is deposited 608 during the step of growing epitaxially 612 the highly doped p+-type layer 304 of GaInAs. In one embodiment, the deposit 608 step produces a δ-doped layer 404 using other methods and process steps for depositing silicon layers as known to those of ordinary skill.

In other embodiments, each of the P-dopants is selected from one of the Group II, IV or V elements, and each of the N-dopants is selected from one of the Group IV or VI elements. In still further embodiments, the substrate, subcells, and tunnel junction materials are selected each from semiconductor materials including germanium, silicon, including crystalline, multicrystalline, and amorphous silicon, polycrystalline thin films including copper indium diselenide (CIS), cadmium telluride (CdTe), and thin film silicon, and crystalline thin films including Gallium Indium Arsenide (GaInAs) and Gallium Indium Phosphide (GaInP). In other embodiments, the substrate, subcells, and tunnel junction materials are selected from the alloys GaAs, InAs, GaP, InP, AlAs, AlP, AlGaInP, AlGaP, AlInP, GaInP, AlInAs, AlGaInAs, GaInAs, GaAsP, GaInAsP, GaAsSb, GaInAsSb, AlInSb, AlGaSb, GaInNAs, GaInNAsSb, GaInNP, GaInNAs, SiGe, Ge, ErP, ErAs, ErGaAs, ErInAs.

The embodiments of the invention shown in the drawings and described above are exemplary of numerous embodiments that may be made within the scope of the appended claims. It is contemplated that numerous other configurations of the S-doped interconnecting tunnel junctions may be created taking advantage of the disclosed approach. It is the applicant's intention that the scope of the patent issuing herefrom will be limited only by the scope of the appended claims.

What is claimed is:

1. A multijunction solar cell, comprising:
   an interconnecting tunnel junction positioned between a first solar cell and a second solar cell, the interconnecting tunnel junction comprising:
   a first layer of a highly doped p or n type semiconductor material directly adjacent the first solar cell;
   a second layer of a complementary highly doped p or n type semiconductor material to that of the first layer; and
   a delta-doped layer having a similar p or n type doping to that of the first layer positioned between and directly adjacent to the first layer and the second layer, or disposed within the first layer more proximate the second layer than the first solar cell, or disposed within the second layer more proximate the first layer than the second solar cell;
   wherein:
   the first layer and the second layer adjoin to form a reversed biased junction; and
   the delta-doped layer is thinner than the first layer and thinner than the second layer, and has a dopant concentration higher than the highly doped, dopant concentration of the first layer and the second layer, the highly doped, dopant concentration being in a range greater than $1\times10^{17}$ cm$^{-3}$ to less than $1\times10^{19}$ cm$^{-3}$.

2. The multijunction solar cell of claim 1, further comprising a substrate directly adjacent the first solar cell or the second solar cell.

3. The multijunction solar cell of claim 1, wherein a dopant concentration in the delta-doped layer is approximately 10 times greater than the highly doped, dopant concentration.

4. The multijunction solar cell of claim 1, wherein a dopant concentration of the delta-doped layer is greater than $10^{20}$ cm$^{-3}$.

5. The multijunction solar cell of claim 1, wherein a dopant concentration of the delta-doped layer is between $10^{19}$ cm$^{-3}$ to $10^{20}$ cm$^{-3}$.

6. The multijunction solar cell of claim 1, wherein a width of the delta-doped layer is approximately 20 Angstroms.

7. The multijunction solar cell of claim 1, wherein the first solar cell comprises a semiconductor material having a bandgap lower than that of the second solar cell.

8. The multijunction solar cell of claim 1, wherein the first solar cell comprises Gallium Indium Arsenide and the second solar cell comprises Gallium Indium Phosphide.

9. The multijunction solar cell of claim 1, wherein the interconnecting tunnel junction comprises a semiconductor material selected from the group consisting of Gallium Arsenide, Gallium Indium Arsenide, Gallium Indium Phosphide, and Aluminum Gallium Arsenide.

10. A multijunction solar cell having an interconnection tunnel junction with a delta-doped layer prepared by a process comprising the steps of:
    preparing a substrate;
    growing epitaxially a first photovoltaic subcell on the substrate;
    growing epitaxially a first layer of a tunnel diode on the first photovoltaic subcell, the first layer using a dopant of an acceptor/donor type of an adjoining portion of the first photovoltaic subcell;
    interrupting the step of growing epitaxially the first layer of the tunnel diode;
    depositing a delta-doped layer of a delta dopant on the first layer of the tunnel diode, the delta dopant in the delta-doped layer reaching a delta dopant concentration substantially greater than a concentration of the dopant in the first layer of the tunnel diode;
    growing epitaxially a second layer of the tunnel diode on the delta-doped layer, the second layer using a complementary dopant of a different acceptor/donor type to the dopant of the first layer of the tunnel diode, and
    wherein the delta-doped layer has a similar doping type to that of the first layer and is disposed between and directly adjacent to the first layer and the second layer or is disposed within the first layer, and the delta-doped layer is thinner than the first layer and thinner than the second layer.

11. The multijunction solar cell of claim 10, further comprising growing epitaxially an additional portion of the first layer using the dopant, after depositing the delta-doped layer and before growing epitaxially the second layer.

12. The multijunction solar cell of claim 10, wherein the first photovoltaic subcell comprises a semiconductor material having a bandgap lower than the second photovoltaic subcell.

13. The multijunction solar cell of claim 10, wherein the tunnel diode comprises a semiconductor material having a bandgap equal to or higher than the first photovoltaic cell.

14. The multijunction solar cell of claim 10, wherein the delta dopant concentration in the delta-doped layer is approximately 10 times greater than the concentration of the dopant in the first layer of the tunnel diode.

15. The multijunction solar cell of claim 10, wherein the delta-doped layer has a delta dopant concentration of greater than $10^{20}$ cm$^{-3}$.

16. The multijunction solar cell of claim 10, wherein a width of the delta-doped layer is approximately 20 Angstroms.

17. The multijunction solar cell of claim 10, wherein the dopant is an acceptor type Group II, IV or V dopant and the complementary dopant is a donor type Group IV or VI dopant.

* * * * *